United States Patent
Loerincz et al.

(10) Patent No.: US 12,375,077 B2
(45) Date of Patent: Jul. 29, 2025

(54) METHOD FOR SWITCHING POWER TRANSISTORS

(71) Applicant: Vitesco Technologies Germany GmbH, Regensburg (DE)

(72) Inventors: Robert Istvan Loerincz, Chisoda (RO); Diego Antongirolami, Nuremberg (DE); Marc Arabackyj, Nuremberg (DE); Matthias Maser, Nuremberg (DE); Eric Taistra, Nuremberg (DE); Sahaya Kulandai Raj Joseph, Fürth (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 26 days.

(21) Appl. No.: 18/308,326

(22) Filed: Apr. 27, 2023

(65) Prior Publication Data
US 2023/0261648 A1 Aug. 17, 2023

Related U.S. Application Data

(63) Continuation of application No. PCT/EP2021/077723, filed on Oct. 7, 2021.

(30) Foreign Application Priority Data

Oct. 27, 2020 (EP) .................................. 20465573

(51) Int. Cl.
*H03K 17/16* (2006.01)
*H03K 17/687* (2006.01)

(52) U.S. Cl.
CPC ......... *H03K 17/161* (2013.01); *H03K 17/163* (2013.01); *H03K 17/687* (2013.01)

(58) Field of Classification Search
CPC .. H03K 17/161; H03K 17/166; H03K 17/163; H03K 17/165; H03K 17/16; H03K 17/687
See application file for complete search history.

(56) References Cited

U.S. PATENT DOCUMENTS

| | | | |
|---|---|---|---|
| 6,269,014 B1 * | 7/2001 | Sander | H02M 7/003 363/132 |
| 2015/0349772 A1 * | 12/2015 | Schubert | H03K 17/567 327/427 |
| 2019/0229723 A1 * | 7/2019 | Nakashima | H03K 17/0822 |

FOREIGN PATENT DOCUMENTS

| | | |
|---|---|---|
| DE | 102013219167 B4 | 3/2017 |
| EP | 3651360 A1 | 5/2020 |
| WO | 2014173969 A1 | 10/2014 |

OTHER PUBLICATIONS

Salvatore Musurneci, et al; Switching-Behavior Improvement of Insulated Gate-Controlled Devices;IEEE Transactions on Power Electronics, vol. 12, No. 4;1997.

(Continued)

*Primary Examiner* — Jung Kim

(57) ABSTRACT

A method for switching power transistors in a power transistor circuit. The power transistors each have a gate, which is driven sequentially by at least three control values in the case of a switch-on sequence and/or a switch-off sequence. A switchover occurs between the control values at specific times. The specific times are determined or modified by a controller, which is driven by a Miller plateau detector for detecting a Miller plateau in a gate-source voltage of the respective power transistor.

15 Claims, 16 Drawing Sheets

(56) References Cited

OTHER PUBLICATIONS

International Search Report and Written Opinion dated Jan. 4, 2022 from corresponding International Patent Application No. PCT/EP2021/077723.
European Search Report dated Mar. 25, 2021 from corresponding European Patent Application No. 20465573.2.

* cited by examiner

METHOD FOR SWITCHING POWER TRANSISTORS

CROSS-REFERENCE TO RELATED APPLICATIONS

This application claims the benefit of International Application PCT/EP2021/077723, filed Oct. 7, 2021, which claims priority to European Application 20465573.2, filed Oct. 27, 2020. The disclosures of the above applications are incorporated herein by reference.

TECHNICAL FIELD

The disclosure relates to a method for switching power transistors.

BACKGROUND

In many applications, such as, for example, brushless DC motors and DC/DC converters, power MOSFETs are used as switches for operating inductive loads. In such applications, the switching of the MOSFETs is normally of significance for electromagnetic compatibility.

With every switchover of one of the MOSFETs, a resonant circuit is excited as a result of parasitic reactive components, and this resonant circuit causes oscillations (overshoot) in the currents and voltages at the MOSFET. The overshoot can cause emissions which are galvanically passed on or emitted and which exceed the limits of electromagnetic compatibility.

WO 2014/173969 A1 discloses a method for switching an electronic component on or off by way of a pulse width modulation signal, which electronic component is designed to output an output signal which is controllable by a control signal. The switch-on and switch-off is initiated within a pulse width modulation clock period at a level change time by a change in the pulse width modulation signal. At least one first control value and one second control value of the control signal are preset, and the control signal is set, within each pulse width modulation clock period, to the first control value between the level change time and a first switchover time, to the second control value between the first switchover time and a second switchover time, and to a third control value after the second switchover time until a gate voltage end value is reached at the gate of the electronic component. Each switchover time of a pulse width modulation clock period is determined depending on an amplitude variable determined during a preceding pulse width modulation clock period in such a way that oscillation amplitudes of the oscillation of the output signal are limited.

SUMMARY

The disclosure provides an improved method for switching power transistors. In some implementations, the power transistors each have a gate, the gate is driven sequentially by at least three control values in the case of a switch-on sequence and/or a switch-off sequence, there being a switchover between the control values at specific times. The times are determined or modified by a controller, which is driven by a Miller plateau detector for detecting a Miller plateau in a gate-source voltage of the respective power transistor. The at least three control values can be different than one another and/or than zero, but can also sometimes correspond to one another. For example, the first control value and the third control value can be identical.

In some implementations, a phase voltage of a half-bridge which is part of the power transistor circuit or any voltage or any current of this half-bridge, for example a drain-source voltage or a gate-source voltage, is supplied to the Miller plateau detector for detecting the Miller plateau. The Miller plateau detector can likewise be based on the detection of voltage transients at a source connection of a power transistor in the lower bridge branch of this half-bridge or on the detection of overshoot.

In some examples, the Miller plateau detector is used to detect when the Miller plateau begins or when the Miller plateau begins and ends.

In some implementations, the Miller plateau is detected in each working cycle in which the respective power transistor is not freewheeling, where this information is used to adapt the times for the next working cycle in which the respective power transistor is not freewheeling.

The power transistor, for example MOSFET, is referred to as freewheeling in the present application when the power transistor (when the power transistor is switched on) or a body diode (when the power transistor is not switched on) of the power transistor carries a freewheeling current of an inductive load.

In some implementations, the Miller plateau is detected by a comparator contained in the Miller plateau detector on the basis of the phase voltage.

In some implementations, during switch-on, the change from a first control value, for example at a gate of the power transistor, such as MOSFET, to a second control value takes place by a time difference prior to the beginning of the Miller plateau and/or the change from the second control value to a third control value takes place during switch-on by a time difference after the beginning of the Miller plateau and/or, during switch-off, the change from the first control value to the second control value takes place by a time difference after the Miller plateau has been reached. Likewise, during switch-off, the change from the first control value to the second control value can take place by a time difference after the Miller plateau has been reached.

In some implementations, the second control value is adapted during the switch-on and switch-off of the power transistor depending on a level of a load current.

In some implementations, the driving using at least three control values only takes place for non-freewheeling power transistors in the power transistor circuit, while freewheeling power transistors are driven by a constant control value.

In some examples, in order to detect whether a power transistor in a half-bridge is freewheeling in the next working cycle, during a dead time during which both power transistors of the half-bridge are switched off, the phase voltage is measured. When the phase voltage is low, the power transistor in a lower branch of the half-bridge is identified as freewheeling in the next working cycle.

In some implementations, in a power transistor circuit having at least two half-bridges, a power transistor which has been driven to switch on by at least three different control values is in principle also driven to switch off in the same working cycle by at least three different control values, and a power transistor which has been driven to switch on by a constant control value is in principle also driven to switch off in the same working cycle by a constant control value apart from when a long pulse is detected which causes a change in the polarity of the phase current of the respective half-bridge.

In some examples, in order to determine a long pulse during switch-on of a power transistor in one of the half-bridges, a counter is started whose counter reading is increased by one every time a new working cycle is used on one of the other half-bridges. When the counter has reached a specific value, the disconnection of the power transistor is performed using at least three different control values.

In some implementations, the times and/or at least one target value of at least one of the time differences are varied depending on the load current.

In some implementations, when using at least three control values, the second control value is adapted corresponding to the level of the load current during the switch-on and switch-off of the power transistor. When using three or more control values, that control value which is used at the end of the Miller plateau can be adapted.

In some examples, the control values are set by a source which is driven by the controller and is operated in a current source mode. The source is switched over from the current source mode to a voltage source mode at the end of the switch-on sequence and/or the switch-off sequence.

In some examples, the end of the switch-on sequence and/or the switch-off sequence is detected by a timer which is triggered at the beginning of the Miller plateau, or a comparator for the gate-source voltage.

The operating strategy for MOSFETs, which is proposed in accordance with the present disclosure, make it possible to switch the MOSFETs and to reduce power losses without causing increased electromagnetic emissions. This is achieved by special features implemented in an integrated circuit, for example an ASIC or ASSP, and without additional external components, with the result that costs and space requirement are reduced and additional switching losses caused by external components are avoided since they delay the overall switching. External components need to be dimensioned for the worst case scenario and increase the switching times.

In contrast to in the prior art, in accordance with the present disclosure, no overshoot detector with the associated layout limitations and high-resolution timers is required.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
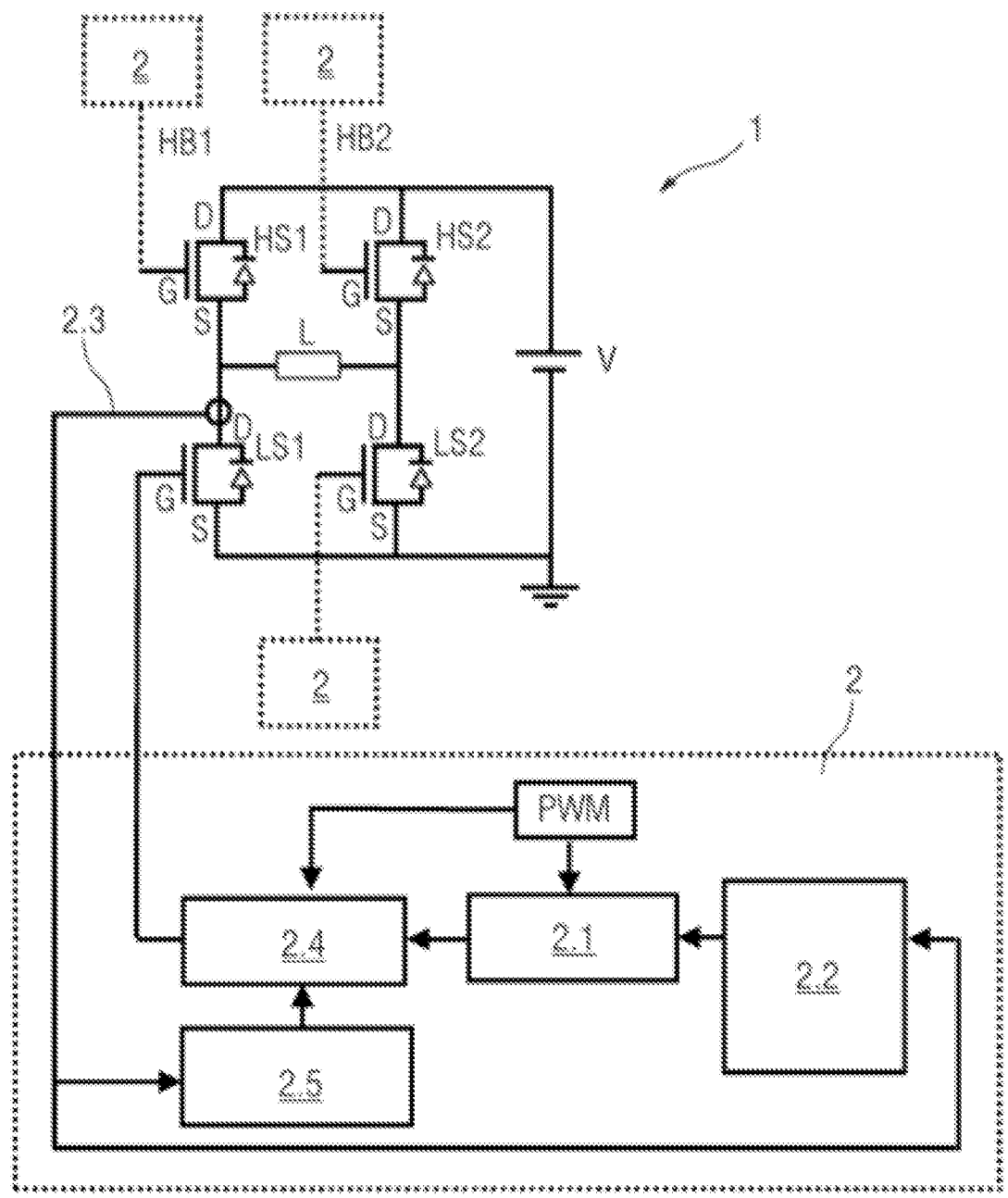
FIG. 1 shows a schematic circuit diagram of a power transistor circuit having power transistors for operating a load.

FIG. 1 shows a schematic circuit diagram of a power transistor circuit, such as a bridge circuit 1, including power transistors for operating a load L, for example MOSFETs HS1, HS2, LS1, LS2 or IGBTs, which are referred to in the text which follows as MOSFETs HS1, HS2, LS1, LS2. The bridge circuit 1 is connected to a voltage source V. Each of the MOSFETs HS1, HS2, LS1, LS2 has a gate G, a drain D and a source S, where the gate G is controllable by a gate driver circuit 2, which applies a pulse-width-modulated signal PWM to the gate G. The gate driver circuit 2 for the MOSFET LS1 is illustrated in detail. The other gate driver circuits 2 can be formed in the same way. Likewise, one and the same gate driver circuit 2 can take over the gates G of all of the MOSFETs HS1, HS2, LS1, LS2 of the bridge circuit 1. The MOSFETs HS1, HS2, LS1, LS2 are arranged in two half-bridges HB1, HB2, where the MOSFETs HS1, LS1 are assigned to the half-bridge HB1 and the MOSFETs HS2, LS2 are assigned to the half-bridge HB2. In addition, in the gate driver circuit 2, a further detector 2.5 can be provided which is configured to detect whether the switching cycle has ended, i.e., whether the MOSFET HS1, HS2, LS1, LS2 is switched off completely. This can take place, for example, by monitoring the gate-source voltage $V_{GS}$ (below a first threshold value means switched off, above a second threshold value means switched on) or a drain-source voltage $V_{DS}$ (voltage drop across drain/source is below a threshold value means completely switched on).

A bridge circuit 1 including MOSFETs HS1, HS2, LS1, LS2 which is controlled pulse width modulation, for example an H bridge, a half-bridge HB1, HB2 or other configurations, can be used in different applications, for example in motor driver circuits or inverters. The MOSFETs HS1, HS2, LS1, LS2 are controlled by a pulse-width-modulated signal in order to apply a desired voltage and/or current characteristic to the load L.

With every switchover of one of the MOSFETs HS1, HS2, LS1, LS2, a resonant circuit is excited as a result of parasitic reactive components, and this resonant circuit causes oscillations (overshoot) in the currents and voltages at the MOSFET HS1, HS2, LS1, LS2. The overshoot can cause emissions which are galvanically passed on or emitted and which exceed the limits of electromagnetic compatibility.

The disclosure makes it possible to limit the emissions and to minimize the switching time by correspondingly shaping a gate current $I_g$ of the MOSFET HS1, HS2, LS1, LS2 during a switch-on/switch-off sequence of the MOSFET HS1, HS2, LS1, LS2.

Figure 8:
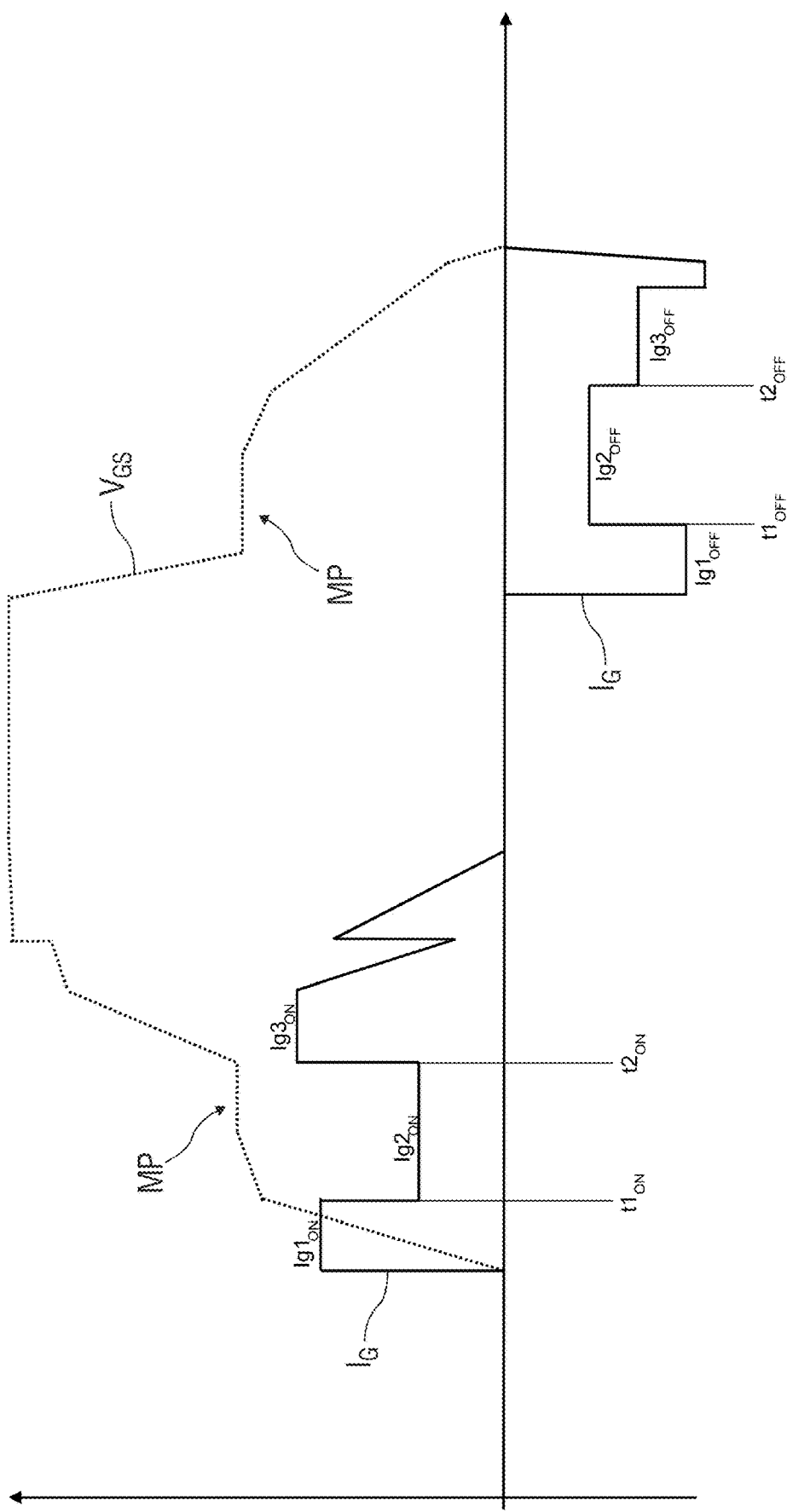
FIG. 8 shows a schematic graph with a switching sequence of a MOSFET.

FIG. 8 shows a schematic graph with a switching sequence of a MOSFET HS, LS.

During a switch-on sequence, as shown in FIG. 8, the gate current $I_g$ begins with a high current value $Ig1_{ON}$, at a time $t1_{ON}$ it is switched to a lower current value $Ig2_{ON}$, and at a time $t2_{ON}$ it is switched back to a high current value $Ig3_{ON}$ which does not need to be identical to the current value $Ig1_{ON}$, but can be. The current values $Ig1_{ON}$, $Ig2_{ON}$, $Ig3_{ON}$ are predefined values. On the other hand, the times $t1_{ON}$ and $t2_{ON}$ are determined by the gate driver circuit 2 by a controller 2.1, which is driven by a Miller plateau detector 2.2 for detecting a Miller plateau MP. The controller 2.1 drives a source 2.4, which fixes the gate current $I_g$. During a switch-off sequence, the gate current $I_g$ begins with a high current value $Ig1_{OFF}$, at a time $t1_{OFF}$ it is switched to a lower current value $Ig2_{OFF}$, and at a time $t2_{OFF}$ it is switched back to a high current value $Ig3_{OFF}$ which does not need to be identical to the current value $Ig1_{OFF}$. The current values $Ig1_{OFF}$, $Ig2_{OFF}$, $Ig3_{OFF}$ are predefined values. On the other hand, the times $t1_{OFF}$ and $t2_{OFF}$ are determined by the gate driver circuit 2 by a controller 2.1, which is driven by a Miller plateau detector 2.2 for detecting a Miller plateau MP. The closed-loop control is implemented over a plurality of working cycles of the pulse width modulation. The gate driver circuit 2 has a measurement connection 2.3, by way of which a phase voltage $V_{PHASE}$ of the respective half-bridge HB1, HB2 can be measured and can be supplied to the Miller plateau detector 2.2. Alternatively, in some examples, any current or any voltage of the half-bridge HB1, HB2 may be measured by the measurement connection 2.3. A further example is a peak value detector, which monitors the voltage transients at the source connection of the MOSFET LS in the lower bridge branch.

Instead of the current values, gate voltage rates of change can also be used as control values.

The method also allows the adaptation of the current value Ig2 on the basis of the load current and can therefore adapt the gate current profile better to the switching process.

In synchronous DC/DC converters or in motor driver circuits, not every switching operation causes emissions which are relevant for electromagnetic compatibility. For example, freewheeling MOSFETs HS, LS are normally uncritical with respect to electromagnetic compatibility. The disclosure describes a possible way of detecting MOSFETs HS, LS which are critical with respect to electromagnetic compatibility and of using the described method for shaping the gate current $I_g$ only with respect to these MOSFETs HS, LS. Freewheeling MOSFETs HS, LS can instead be operated by a constant gate current $I_g$.

The control loop is based on the detection of the Miller plateau MP. In many applications, the parameter with the highest dynamic which influences the Miller plateau MP is the load current $I_{LOAD}$, i.e. in the case of motor driver circuits the phase current $I_{PHASE}$. It may arise that a controller 2.1 is too slow to follow the fluctuations in the load current $I_{LOAD}$. The disclosure therefore describes a possible way of improving the accuracy of the closed-loop control for the case of quick, dynamic output currents in order to reduce further emissions which are relevant for electromagnetic compatibility. In one implementation, the controller 2.1 is in the form of an I controller.

Real current sources cannot provide the desired current over the entire voltage range. For this reason, it is not possible in the prior art to achieve the desired gate-source voltage $V_{GS}$ at the end of the switch-on sequence and the switch-off sequence. The disclosure describes a possible way of achieving the desired gate-source voltage $V_{GS}$ without impairing electromagnetic compatibility.

Figure 2:
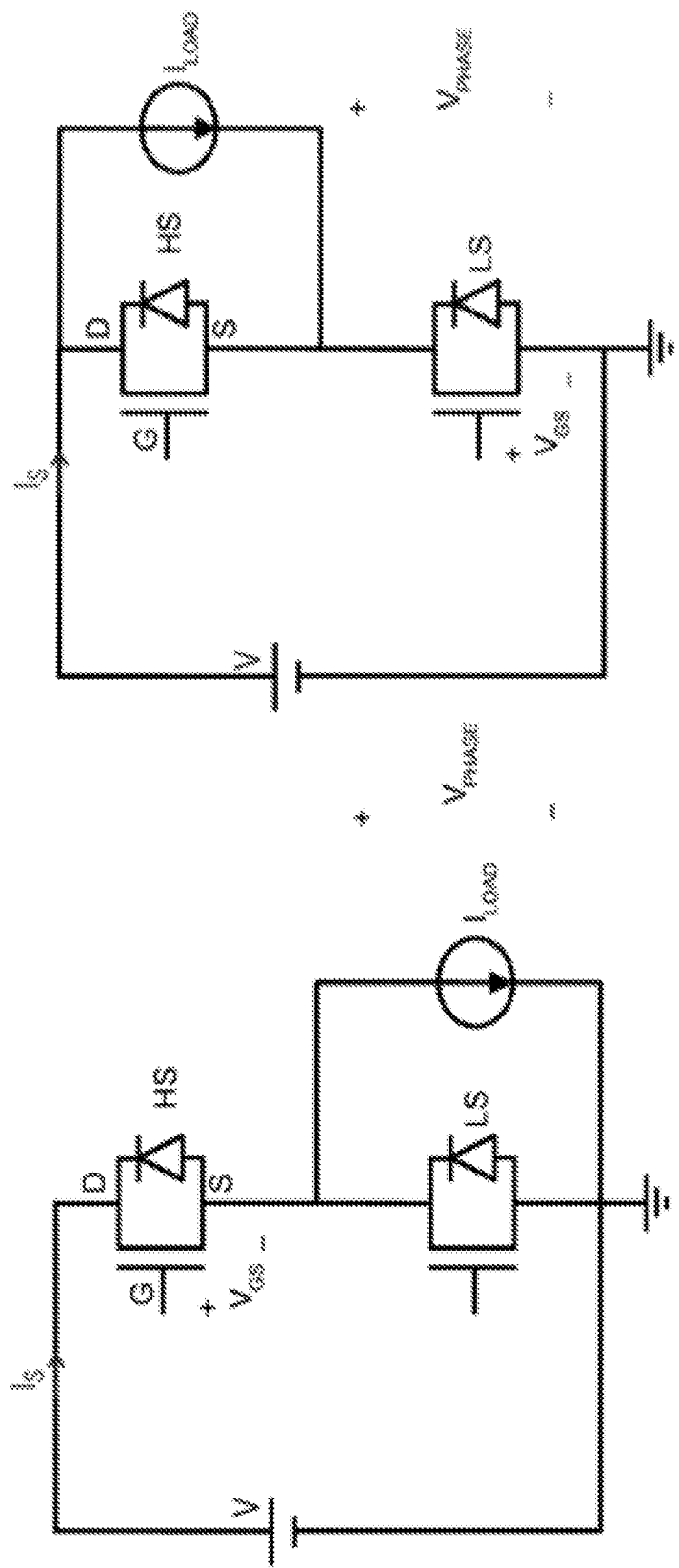
FIG. 2 shows a schematic circuit diagram of a simplified half-bridge.

FIG. 2 shows a schematic circuit diagram of a simplified half-bridge HB1. Half-bridges HB1, HB2 for operating an inductive load L, for example DC/DC converters, H-bridge motor driver circuits or B6 motor driver circuits, can be simplified, as shown in FIG. 2. In some applications, such as, for example, one-quadrant DC/DC converters, the load current $I_{LOAD}$ always has the same polarity. In other applications, such as, for example, motor driver circuits, the polarity of the load current $I_{LOAD}$ can change over time.

If the load current $I_{LOAD}$ is positive, as illustrated on the left in FIG. 2, the switching of the MOSFET HS in the upper bridge branch causes a quick change in the supply current Is and in the phase voltage $V_{PHASE}$ and triggers overshoot. In this case, the MOSFET LS in the lower bridge branch is in the freewheeling path and the switching of the MOSFET LS does not cause any overshoot, any change in the supply current Is and only a slight change in the phase voltage $V_{PHASE}$.

If the load current $I_{LOAD}$ is negative, as illustrated on the right in FIG. 2, the switching of the MOSFET LS in the lower bridge branch causes a quick change in the supply current and in the phase voltage $V_{PHASE}$ and triggers overshoot. In this case, the MOSFET HS in the upper bridge branch is freewheeling and the switching of the MOSFET HS does not cause any overshoot, any change in the supply current and only a slight change in the phase voltage $V_{PHASE}$.

Overshoot and quick changes in the supply current and in the phase voltage $V_{PHASE}$ normally cause the galvanically passed-on or emitted emissions to exceed the specifications of electromagnetic compatibility. Overshoot and quick changes in the supply current Is and in the phase voltage $V_{PHASE}$ can be reduced by virtue of the MOSFET HS, LS responsible, i.e., the MOSFET HS in the case of a positive load current $I_{LOAD}$ and the MOSFET LS in the case of a negative load current $I_{LOAD}$, being driven correspondingly.

Figure 3:
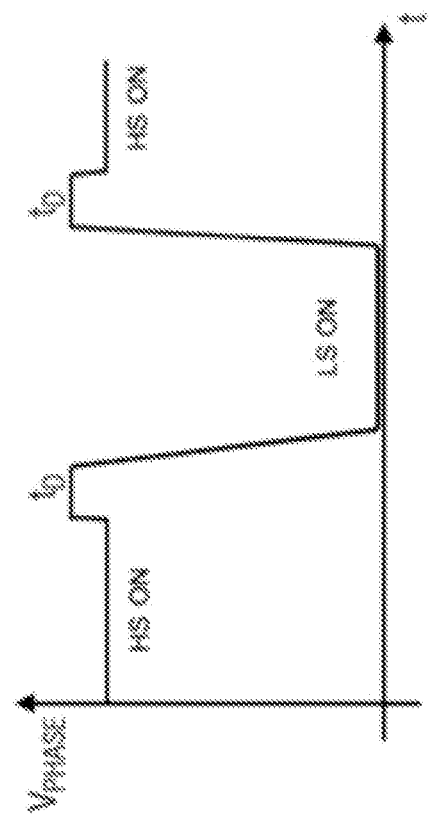
FIG. 3 shows schematic graphs of a phase voltage over time during switching of MOSFETs.
Figure 3:
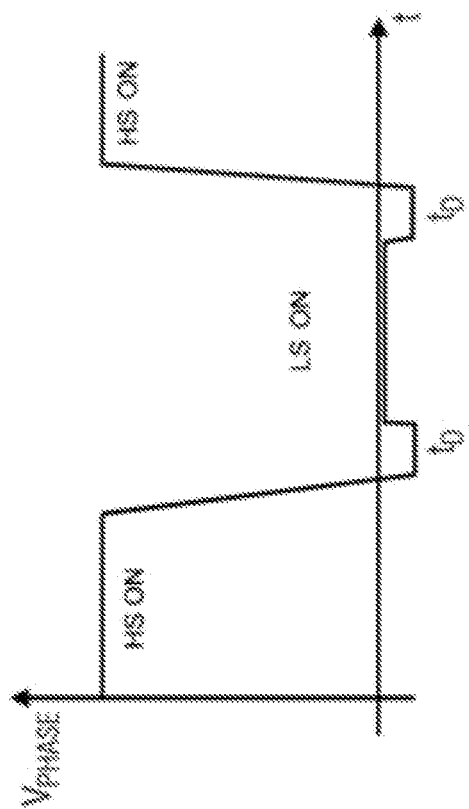

In order to avoid a short circuit, a dead time $t_d$ is always provided, while the two MOSFETs HS, LS of the half-bridge HB1 are switched off. During the dead time $t_d$, the load current $I_{LOAD}$ flows in the body diode of the MOSFET HS, LS. When the load current $I_{LOAD}$ is positive, it flows in the body diode of the MOSFET LS. When the load current $I_{LOAD}$ is negative, it flows in the body diode of the MOSFET HS. Therefore, during the dead time $t_d$, the phase voltage $V_{PHASE}$ is low when the phase current $I_{PHASE}$ is positive, and the phase voltage $V_{PHASE}$ is high when the phase current $I_{PHASE}$ is negative, as shown in FIG. 3. FIG. 3 shows schematic graphs of the phase voltage $V_{PHASE}$ over time t during switching of the MOSFET HS, LS, where a switching state HS ON symbolizes the switched-on MOSFET HS in the upper bridge branch and LS ON symbolizes the switched-on MOSFET LS in the lower bridge branch.

Figure 4:
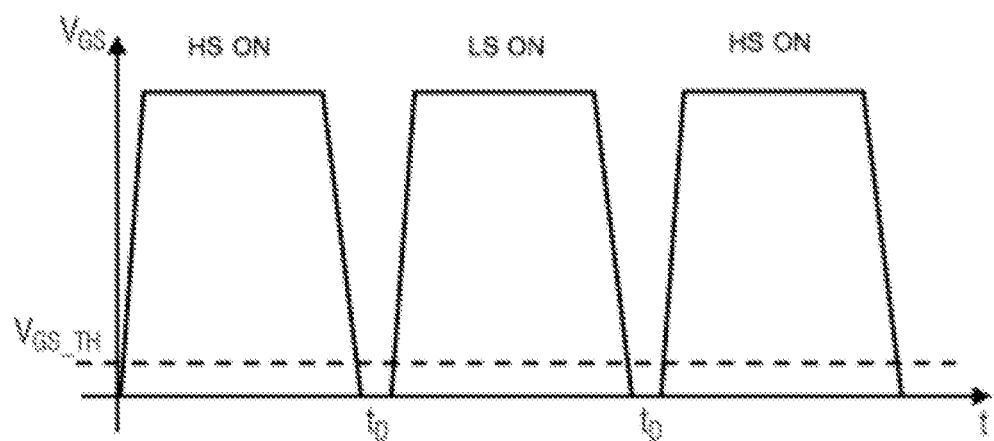
FIG. 4 shows a schematic graph of a gate-source voltage of a MOSFET over time during switching, where a dead time ensures that a MOSFET in an upper bridge branch is never switched on at the same time as a MOSFET in a lower bridge branch.

The device in which the present disclosure is implemented, i.e., the gate driver circuit 2, can detect whether the two MOSFETs HS, LS are switched off, and can measure the phase voltage $V_{PHASE}$ during the dead time $t_d$. One possible way of detecting that the two MOSFETs HS, LS are switched off is to check when the two gate-source voltages $V_{GS}$ of the two MOSFETs HS, LS are below a threshold value $V_{GS\_TH}$ at the same time, as is shown in FIG. 4. FIG. 4 shows a schematic graph of the gate-source voltage $V_{GS}$ of a MOSFET HS, LS over time t during switching of the MOSFET HS, LS.

Figure 10:
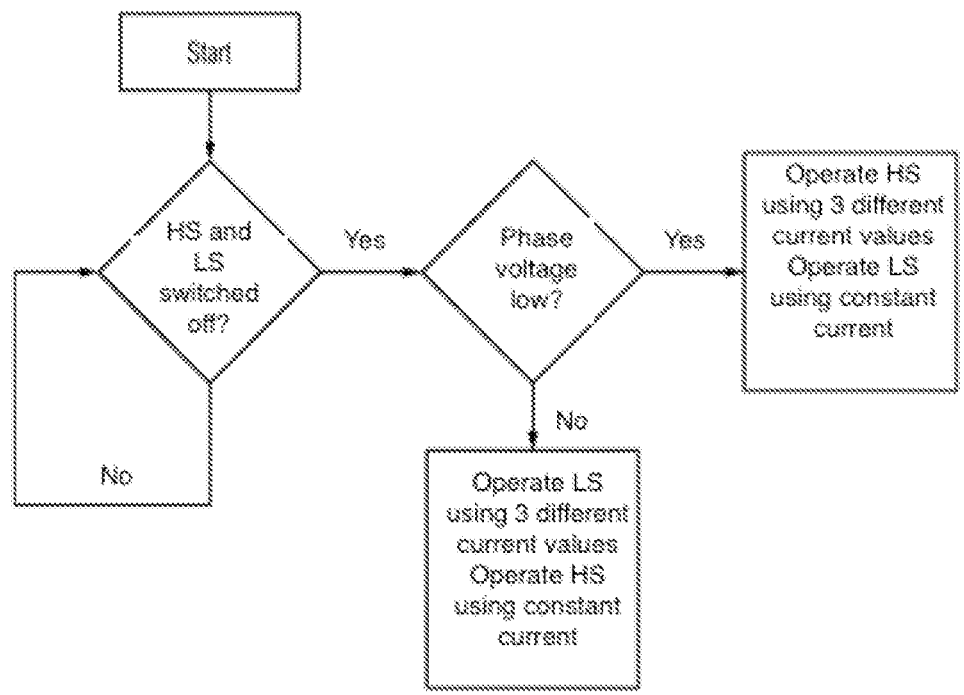
FIG. 10 shows a schematic view of an algorithm for determining which MOSFET in a half-bridge is freewheeling, i.e., the MOSFET through which the freewheeling current is flowing.

The measurement of the phase voltage $V_{PHASE}$ is then used to detect whether the next MOSFET to be switched on is freewheeling or not, as is shown in the algorithm illustrated in FIG. 10. When the phase voltage $V_{PHASE}$ is low, the MOSFET HS in the upper branch of the half-bridge HB1 to HB3 is operated as the next using at least three different current values Ig1, Ig2, Ig3. Otherwise, the MOSFET LS in the lower branch of the half-bridge HB1 to HB3 is operated as the next using at least three different current values Ig1, Ig2, Ig3. The level of the phase voltage $V_{PHASE}$ can be determined using a hysteresis comparator. For example, the phase voltage $V_{PHASE}$ is considered to be low when it is below 25% of a fixed value and is considered to be high when it is above 75% of the fixed value. Each half-bridge HB1 to HB3 has a dedicated phase voltage $V_{PHASE}$ and the state of this phase voltage $V_{PHASE}$ during the dead time $t_D$ determines how the MOSFETs HS, LS of this half-bridge HB1 to HB3 are controlled. One or more half-bridges HB1 to HB3 can be provided. Three or more current values Ig1, Ig2, Ig3 can be provided for controlling the gate G.

FIG. 10 shows a schematic view of an algorithm for determining which MOSFET HS, LS in a half-bridge HB1, HB2 is freewheeling.

If the next MOSFET HS, LS to be driven is freewheeling, it is driven by a constant gate current $I_g$. Otherwise, it is driven during the switching using at least three different current values Ig1, Ig2, Ig3, as described in WO 2014/173969 A1 and shown in FIG. 5 for the freewheeling MOSFET LS and FIG. 6 for the freewheeling MOSFET HS.

Figure 5:
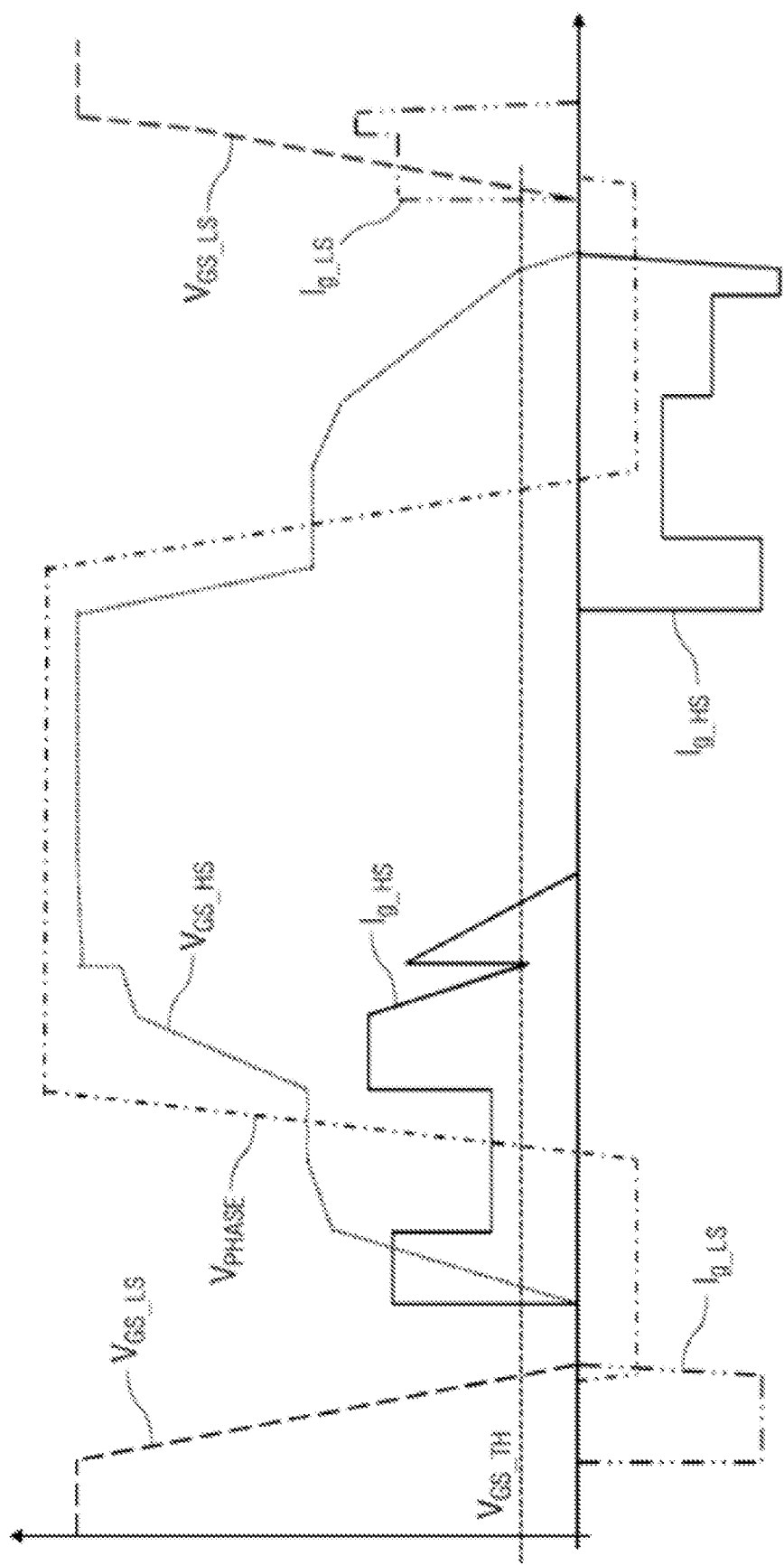
FIG. 5 shows a schematic graph of a switching sequence of the half-bridge in the case of a freewheeling MOSFET, i.e., during the flow of a freewheeling current through the MOSFET in the lower bridge branch.
Figure 6:
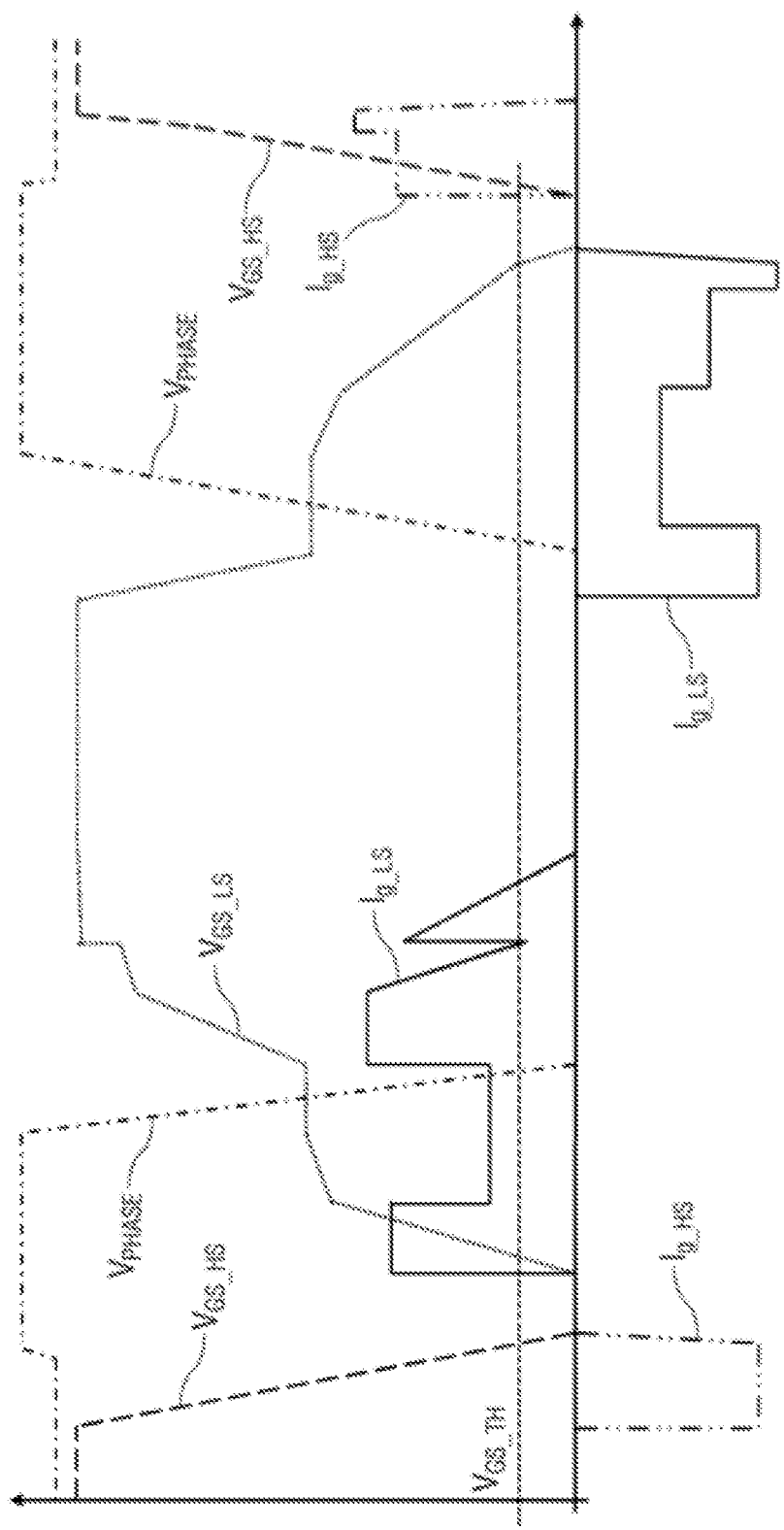
FIG. 6 shows a schematic graph of a switching sequence of the half-bridge in the case of a freewheeling MOSFET, i.e., during the flow of a freewheeling current through the MOSFET in the upper bridge branch.

FIG. 5 shows a schematic graph of a switching sequence of the half-bridge HB1 in the case of a freewheeling MOSFET LS, where a gate-source voltage $V_{GS\_LS}$ of the MOSFET LS, a gate-source voltage $V_{GS\_HS}$ of the MOSFET HS, a gate current $I_{g\_LS}$ of the MOSFET LS, a gate current $I_{g\_HS}$ of the MOSFET HS and the phase voltage $V_{PHASE}$ are illustrated. FIG. 6 shows a schematic graph of a switching sequence of the half-bridge HB1 in the case of a freewheeling MOSFET HS, wherein a gate-source voltage $V_{GS\_LS}$ of the MOSFET LS, a gate-source voltage $V_{GS\_HS}$ of the MOSFET HS, a gate current $I_{g\_LS}$ of the MOSFET LS, a gate current $I_{g\_HS}$ of the MOSFET HS and the phase voltage $V_{PHASE}$ are illustrated.

In some examples, the driving of the gates G takes place corresponding to the control device described in WO 2014/173969 A1 and the method described therefor, for example, in accordance with FIGS. 1 and 3 to 18 and the description on pages 8 to 26. WO 2014/173969 A1 is hereby fully included by reference in the present patent application.

Figure 7:
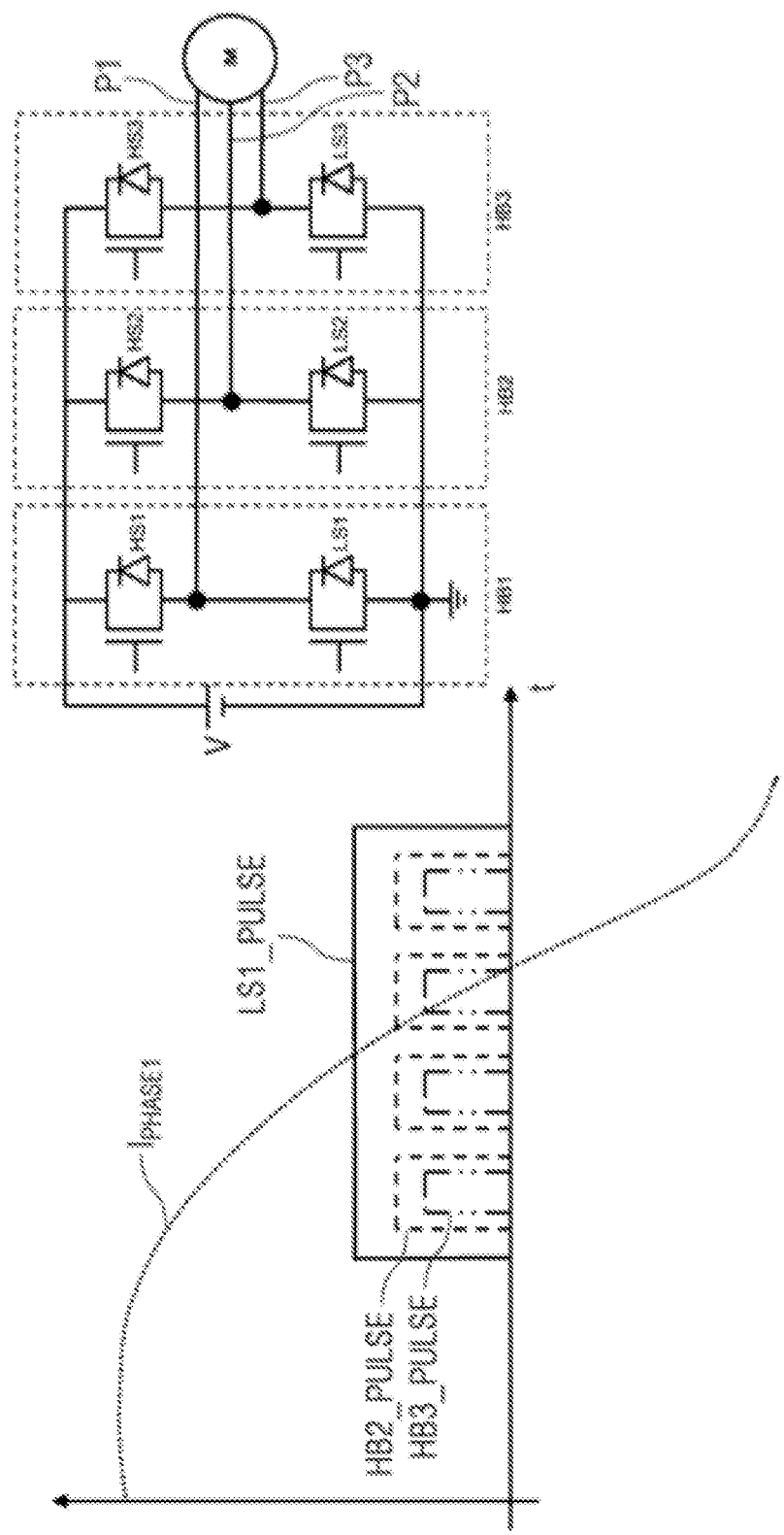
FIG. 7 shows a schematic circuit diagram of a bridge circuit for operating a three-phase electric motor and a schematic graph.

The switch-off is performed in the same way as the switch-on: When a gate current $I_g$ with at least three different current values Ig1, Ig2, Ig3 has been used for switch-on, it is also used during switch-off. When a constant current has been used during switch-on, it is also used during switch-off apart from when long pulses are detected which cause a change in the polarity of the phase current $I_{PHASE}$. In applications in which a brushless DC motor is used, long pulses could be used either on the MOSFET HS or on the MOSFET LS. These pulses cause the inversion of the polarity of the phase current $I_{PHASE}$ as is shown in FIG. 7. FIG. 7 shows a schematic circuit diagram of a bridge circuit 1 for operating a three-phase electric motor M, where three half-bridges HB1, HB2, HB3 are provided for in each case one phase P1, P2, P3. In addition, a schematic graph is shown in which the phase current $I_{PHASE1}$ of the first half-bridge HB1 and the switching state LS1_PULSE of the MOSFET LS1 of the first half-bridge HB1, the switching state HB2_PULSE of the second half-bridge HB2 and the switching state HB3_PULSE of the third half-bridge HB3 are illustrated over time t. The switching states HB2_PULSE and HB3_PULSE correspond to the pulse-width-modulated signals for controlling the half-bridges HB2, HB3. For example, the MOSFET LS1, LS2, LS3 in the lower bridge branch of the respective half-bridge HB1, HB2, HB3 can be switched on when the respective pulse-width-modulated signal has a low level and the MOSFET HS1, HS2, HS3 in the upper bridge branch of the respective half-bridge HB1, HB2, HB3 can be switched on when the respective pulse-width-modulated signal has a high level. The pulse-width-modulated signals are illustrated with different amplitudes merely for improved identifiability. The switching state LS1_PULSE corresponds to an inverted switching state HB1_PULSE (not illustrated). With regard to FIG. 7, it should be assumed, by way of example, that the MOSFET LS1 in the half-bridge HB1 is switched on when the corresponding phase current $I_{PHASE1}$ is positive. In that case, the MOSFET LS1 is freewheeling during switch-on. It should further be assumed that the MOSFET LS1 remains switched on long enough for a polarity reversal on the phase current $I_{PHASE1}$ of the phase P1 to take place. During switch-off, the MOSFET LS1 is therefore not freewheeling. When the MOSFET LS1 is switched off by a constant gate current $I_g$, it can generate quick switching, as a result of which problems can be caused with respect to electromagnetic compatibility. The gate driver circuit 2 in which the disclosure is implemented is capable of detecting long pulses of the two MOSFETs HS and LS in each half-bridge HB1, HB2, HB3 by virtue of the pulses on the other half-bridges HB1, HB2, HB3 being counted. For the case considered in FIG. 7, therefore, a counter is started when the MOSFET LS1 is switched on. The counter reading is increased by one every time a new working cycle of the pulse width modulation is used on any of the other half-bridges HB2, HB3. When the counter has reached a specific value, the disconnection of the MOSFET LS1 is performed using at least three different current values Ig1, Ig2, Ig3.

The aim during driving of a MOSFET using at least three different current values Ig1, Ig2, Ig3 during switching, as is described in WO 2014/173969 A1 and shown in FIG. 8, consists in reducing emissions and optimizing switching losses depending on requirements. The method described in WO 2014/173969 A1 uses an overshoot measurement in order to adapt the times $t1_{ON}$, $t1_{OFF}$, $t2_{ON}$, $t2_{OFF}$ during switch-on and switch-off in terms of the closed-loop control. The overshoot measurement yields substantially the following information:

When and how quickly the Miller plateau MP is reached during switch-on.

When and how quickly the Miller plateau MP is left during switch-off.

Figure 9:
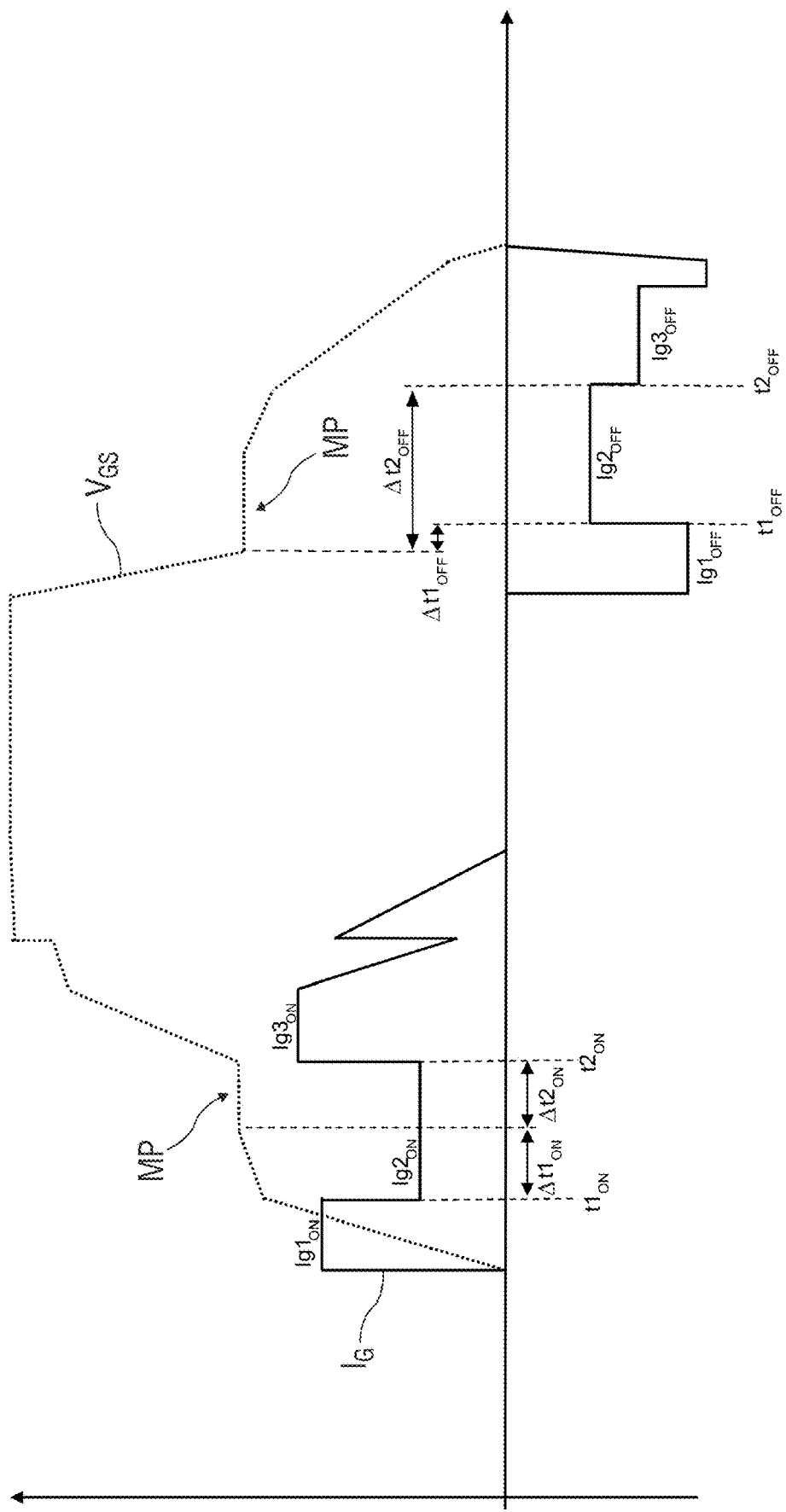
FIG. 9 shows a schematic graph with a switching sequence of a MOSFET.

The present disclosure is therefore a further development of the procedure described in WO 2014/173969 A1. The overshoot measurement can be replaced by any other method for detecting the Miller plateau MP. As soon as the information on the Miller plateau MP is known, the times $t1_{ON}$, $t2_{ON}$ for the switch-on and the times $t1_{OFF}$ and $t2_{OFF}$ for the switch-off can be calculated and adapted on the basis thereof, as shown in FIG. 9. FIG. 9 shows a schematic graph with a switching sequence of a MOSFET HS, LS. For example, during switch-on the change from the current value $Ig1_{ON}$ to the current value $Ig2_{ON}$ takes place by a time difference $\Delta t1_{ON}$ prior to the beginning of the Miller plateau MP. The change from the current value $Ig2_{ON}$ to the current value $Ig3_{ON}$ takes place during switch-on by a time difference $\Delta t2_{ON}$ after the beginning of the Miller plateau MP. During switch-off, the change from the current value $Ig1_{OFF}$ to the current value $Ig2_{OFF}$ takes place by a time difference $\Delta t1_{OFF}$ after the Miller plateau MP has been reached. The change from the current value $Ig2_{OFF}$ to the current value $Ig3_{OFF}$ takes place during switch-off shifted by a time difference $\Delta t2_{OFF}$.

The time differences $\Delta t1_{ON}$, $\Delta t2_{ON}$, $\Delta t1_{OFF}$ and $\Delta t2_{OFF}$ can be positive or negative depending on the requirements of the application.

Two types of Miller plateau detectors 2.2 are proposed which are particularly suitable for the present disclosure:
1) A Miller plateau detector 2.2 which indicates when the Miller plateau MP begins.
2) A Miller plateau detector 2.2 which indicates when the Miller plateau MP begins and ends.

Figure 11:
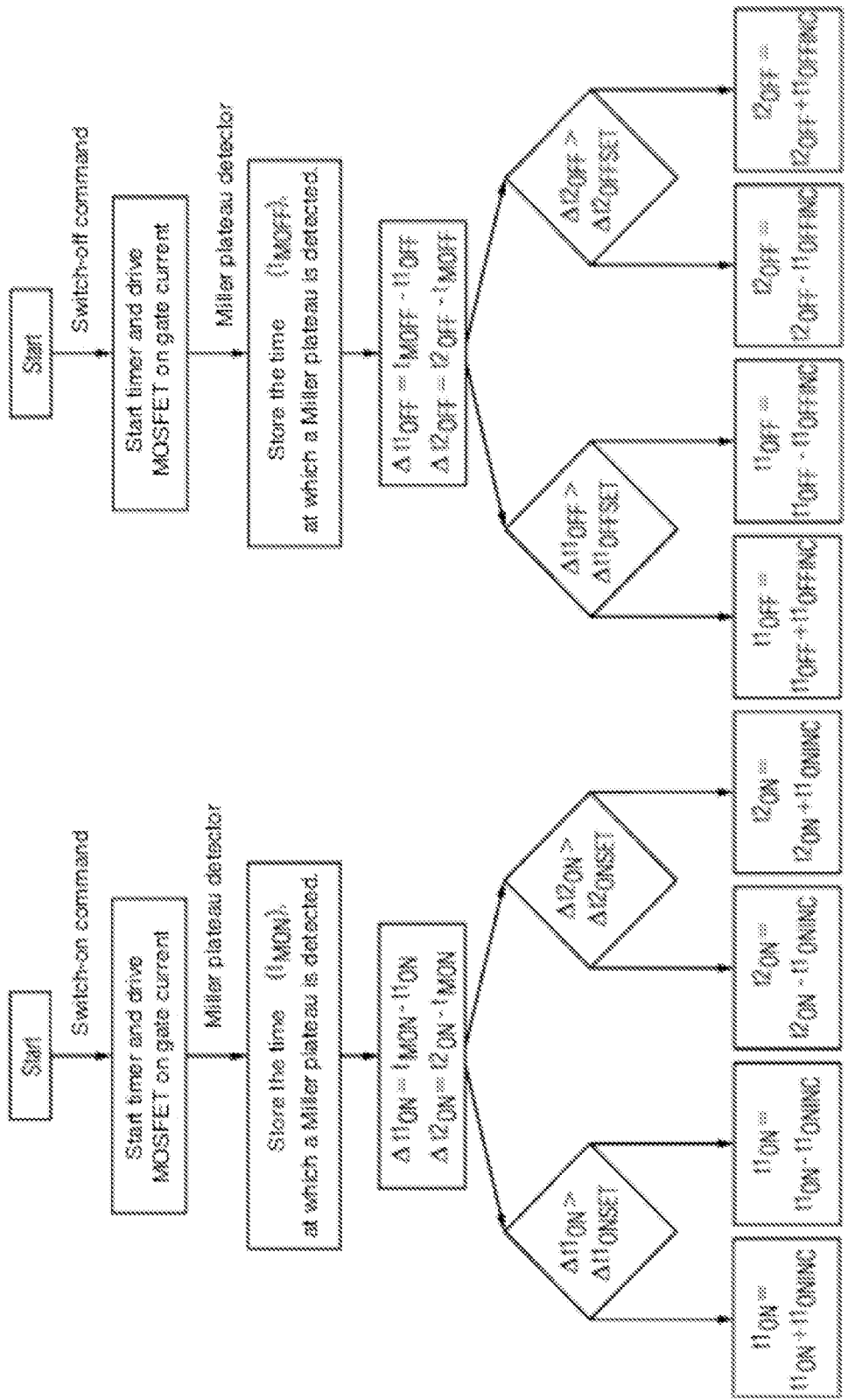
FIG. 11 shows a schematic view of a state machine of the MOSFET for adapting the times for the switch-on and for the switch-off when the respective MOSFET is operated by at least three current values.

In the case of a Miller plateau detector 2.2, the Miller plateau MP is detected in each working cycle of the pulse width modulation in which the MOSFET LS, HS is not freewheeling, and this information is used to adapt the times $t1_{ON}$ $t2_{ON}$ for the switch-on and the times $t1_{OFF}$ and $t2_{OFF}$ for the switch-off in order to obtain the time differences $\Delta t1_{ON}$, $\Delta t2_{ON}$, $\Delta t1_{OFF}$ and $\Delta t2_{OFF}$ in the next working cycle closer to a target value of the time difference $\Delta t1_{ONSET}$, $\Delta t2_{ONSET}$, $\Delta t1_{OFFSET}$, $\Delta t2_{OFFSET}$, as is shown in FIG. 11. FIG. 11 shows a schematic view of a state machine of the MOSFET HS or LS for adapting the times $t1_{ON}$, $t2_{ON}$ for the switch-on and the times $t1_{OFF}$ and $t2_{OFF}$ for the switch-off when the respective MOSFET HS, LS is operated by at least three current values Ig1, Ig2, Ig3. FIG. 11 illustrates an example of the controller 2.1. In the case of a switch-on command for the MOSFET HS, LS, a timer is started, and the MOSFET HS, LS is driven by the gate current $I_g$. As soon as the Miller plateau detector 2.2 detects a Miller plateau MP, the corresponding time $t_{MON}$ is stored. Then, the time difference $\Delta t1_{ON}$ is determined as the difference between the times $t_{MON}$ and $t1_{ON}$ and the time difference $\Delta t2_{ON}$ is determined as the difference between the times $t2_{ON}$ and $t_{MON}$.

In the working cycle, if the difference between the target value $\Delta t1_{ONSET}$, $\Delta t2_{ONSET}$, $\Delta t1_{OFFSET}$, $\Delta t2_{OFFSET}$ and the respective measured value $\Delta t1_{ON}$, $\Delta t2_{ON}$, $\Delta t1_{OFF}$, $\Delta t2_{OFF}$ is not 0, the relevant times $t1_{ON}$, $t2_{ON}$, $t1_{OFF}$ and $t2_{OFF}$ are increased/reduced by an increment $t1_{ONINC}$, $t2_{ONINC}$, $t1_{OFFINC}$ and $t2_{OFFINC}$ which can be constant or proportional to the error signal (difference between the target value $\Delta t$ and the measured value $\Delta t$).

Figure 12:
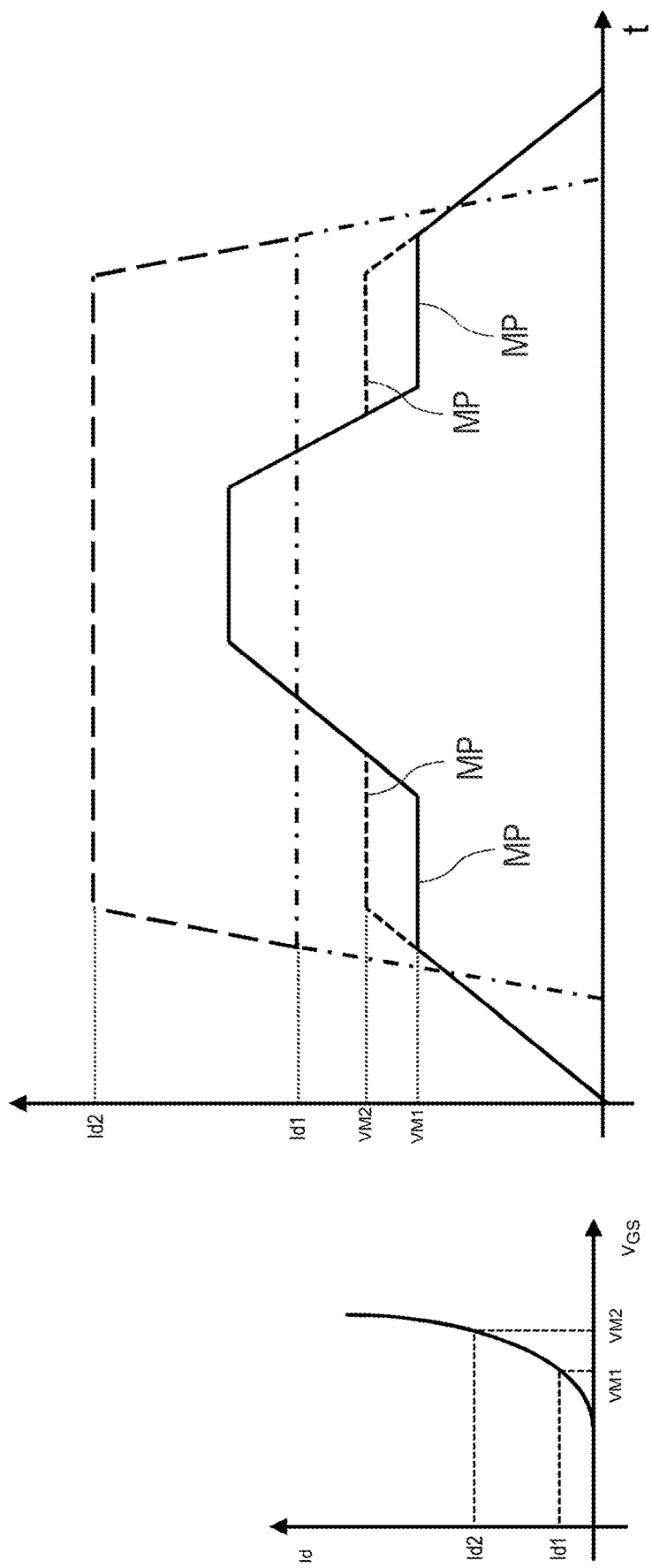
FIG. 12 shows schematic graphs for illustrating the relationship between a drain current and a voltage of a Miller plateau.
Figure 13:
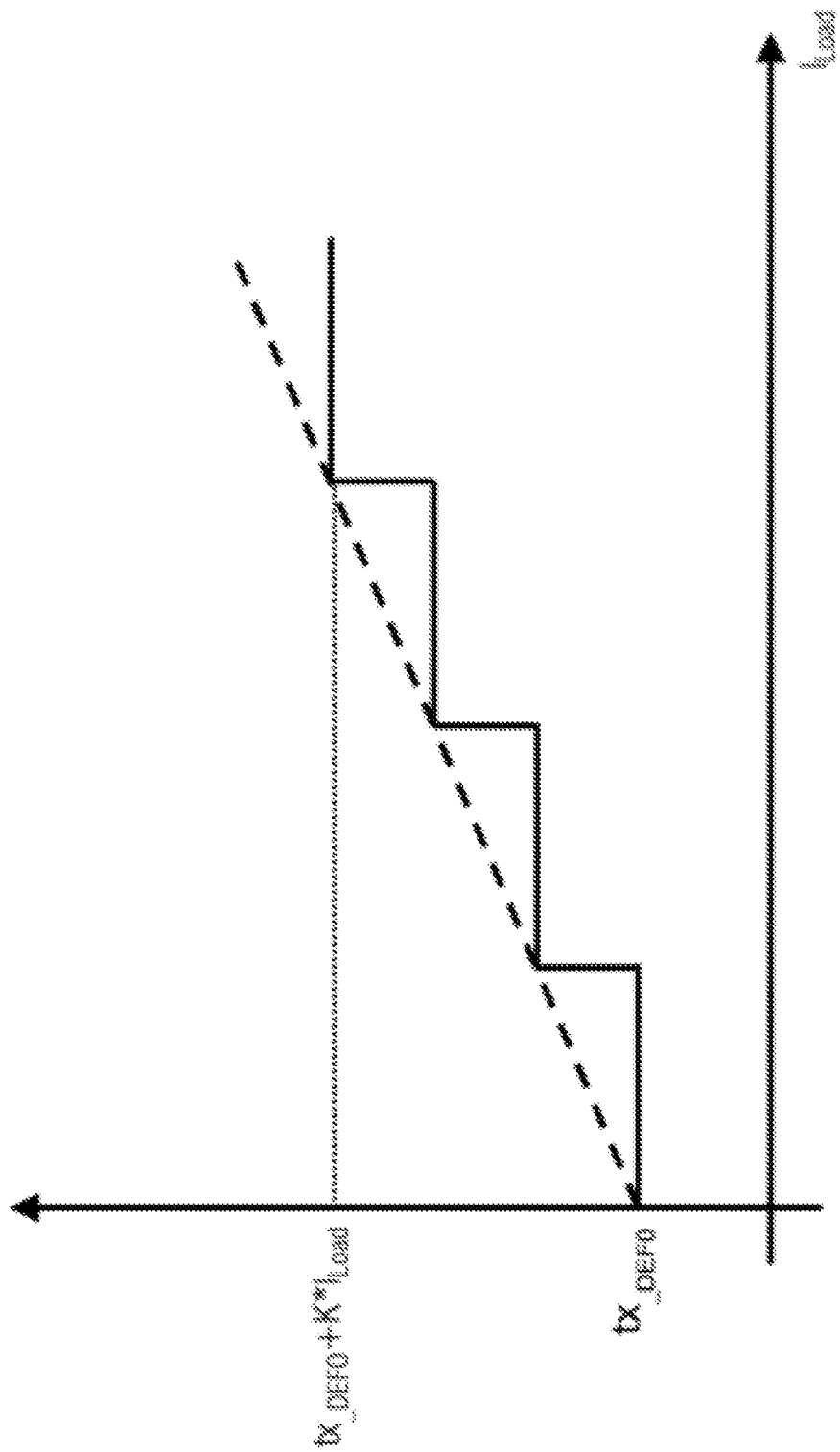
FIG. 13 shows a schematic graph for illustrating a relationship between a load current and a time for switchover of a current value.

The closed-loop control of the times $t1_{ON}$, $t2_{ON}$, $t1_{OFF}$ and $t2_{OFF}$ is based on the detection of the Miller plateau MP. The load current $I_{LOAD}$ is normally the parameter with the quickest dynamic which can influence the Miller plateau MP. When the load current $I_{LOAD}$ or the drain current Id is increased by a current value Id1 to a current value Id2, the voltage VM1, VM2 of the Miller plateau MP is also increased, as is shown in FIG. 12 (both the transfer characteristics and the curves in the time range). The times $t1_{ON}$, $t2_{ON}$, $t1_{OFF}$ and $t2_{OFF}$ should be adapted corresponding to the voltage VM1, VM2 of the Miller plateau MP in order to maintain the desired time differences $\Delta t1_{ON}$, $\Delta t2_{ON}$, $\Delta t1_{OFF}$ and $\Delta t2_{OFF}$. When, for example, the voltage VM1, VM2 of the Miller plateau MP increases, the time $t1_{ON}$ should also be increased in order to obtain the desired time difference $\Delta t1_{ON}$. A default value $t_{x\_DEF}$ has been defined for each time $t1_{ON}$, $t2_{ON}$, $t1_{OFF}$ and $t2_{OFF}$. The default value $t_{x\_DEF}$ is used at the beginning in order to initialize the controller 2.1. In order to accelerate the controller 2.1, a ratio (linear or nonlinear in accordance with requirement) with respect to the load current $I_{LOAD}$ can be implemented, as shown in FIG. 13 (only linear cases are shown). The relevant default value $t_{x\_DEF}$ can be calculated for each load current $I_{LOAD}$ (or load current range when the implementation takes place digitally) by a constant factor K (for example $t_{x\_DEF} = t_{x\_DEF0} + K*I_{Load}$). The controller 2.1 can then perform the closed-loop control and find the optimal value for each load current $I_{LOAD}$ (load current range). The constant factor K can be fixed for the respective application.

A controller 2.1 in accordance with a second implementation builds upon the first implementation. When using at least three current values Ig1, Ig2, Ig3 for the gate current $I_g$, the gate current $I_g$ is stepped down in the second section during the commutation (switchover) to the second current value Ig2 in order that the overshoot remains within an acceptable range. The detection of the Miller plateau MP together with the maintenance of the target values of the time difference $\Delta t1_{ONSET}$, $\Delta t2_{ONSET}$, $\Delta t1_{OFFSET}$ and $\Delta t2_{OFFSET}$ ensures that the gate G of the MOSFET HS, LS is driven during the commutation (switchover) by the selected second current value Ig2 of the gate current $I_g$. A fixed current value Ig2 of the gate current $I_g$ is, however, not optimal for the entire range of load currents LOAD.

Figure 14:
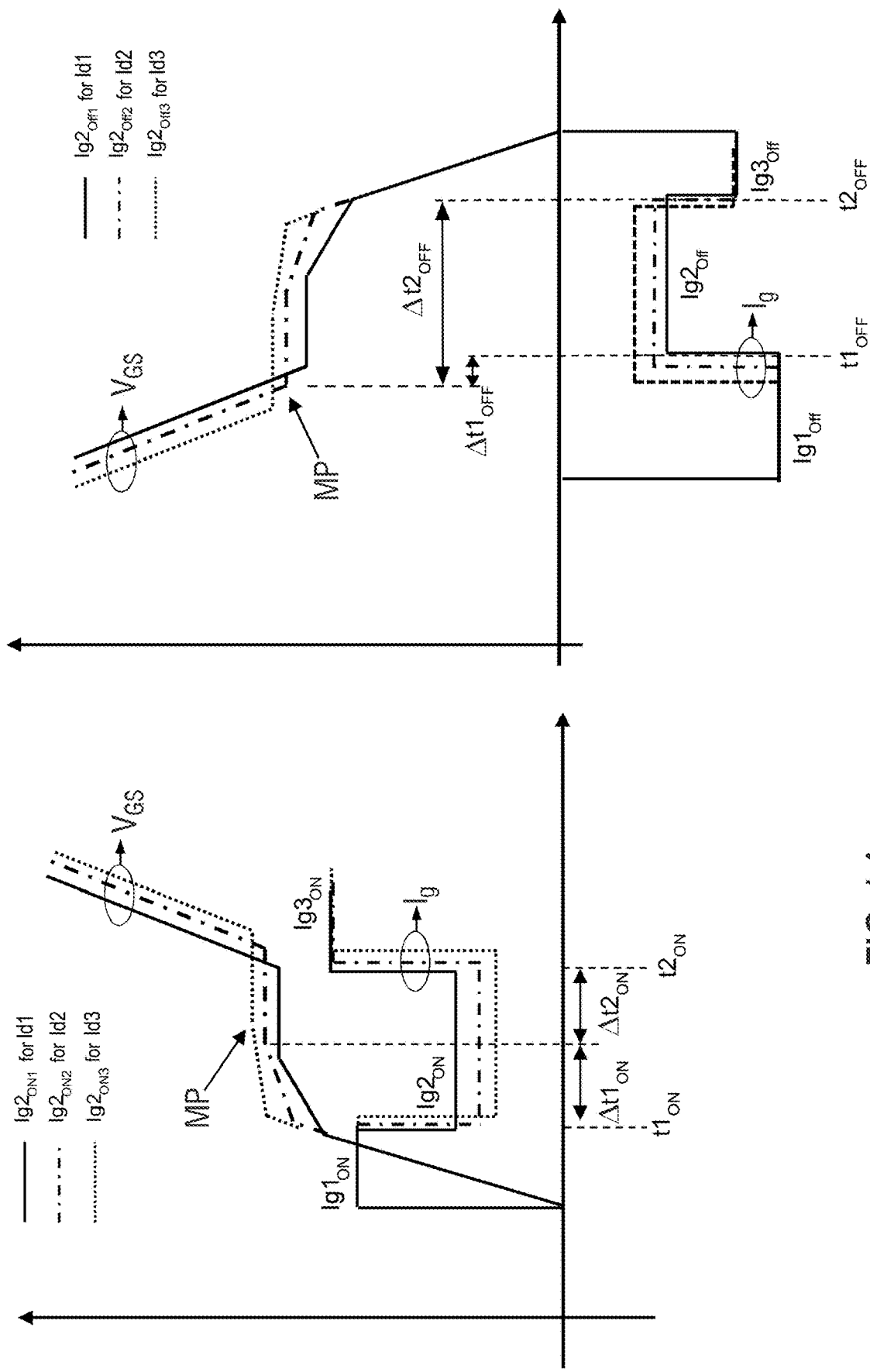
FIG. 14 shows schematic graphs of a switch-on sequence and a switch-off sequence of a MOSFET.

Therefore, when using at least three current values Ig1, Ig2, Ig3 for the gate current $I_g$, the second current value Ig2 can be adapted during the switch-on and switch-off of the MOSFET HS, LS corresponding to the level of the load current $I_{LOAD}$ (see FIG. 14). FIG. 14 shows, on the left-hand side, a schematic graph of a switch-on sequence and, on the right-hand side, a schematic graph of a switch-off sequence of a MOSFET HS, LS.

This adaptation of the current value Ig2 provides the additional possibility of optimizing the overshoot and the power losses by virtue of the rate of rise of the gate-source voltage $V_{GS}$ during the commutation (switchover) of the current being changed, as is shown in FIG. 14.

Figure 15:
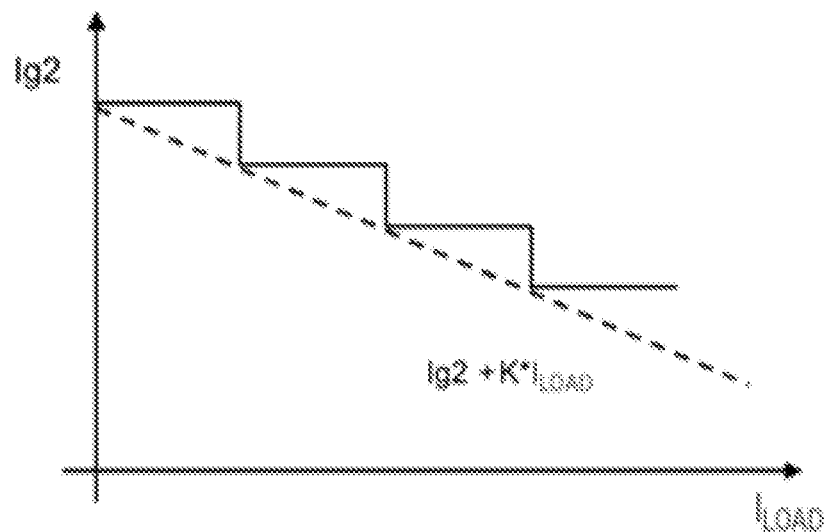
FIG. 15 shows a schematic graph of a second current value of a gate current as a function of a load current.

For this purpose, the range of the load currents LOAD is split into N subranges, as is shown in FIG. 15. FIG. 15 is a schematic graph of the second current value Ig2 of the gate current $I_g$ as a function of the load current $I_{LOAD}$. Each subrange corresponds to a specific current value Ig2. The steepness of this curve is fixed corresponding to the requirements of electromagnetic compatibility and loss requirements. For the subrange of the load current $I_{LOAD}$, the current value Ig2 is adapted in order to ensure closed-loop control of the target values of the time difference $\Delta t1_{ONSET}$, $\Delta t2_{ONSET}$, $\Delta t1_{OFFSET}$ and $\Delta t2_{OFFSET}$.

The closed-loop control of the preset values of the time difference $\Delta tx$ takes place in a similar manner to the flowchart shown in FIG. 11. If, for example, $\Delta t1_{ON}$ is greater than $\Delta t1_{ONSET}$, $Ig2_{ON}$ is increased by an increment $Ig2_{ONINC}$.

Figure 16:
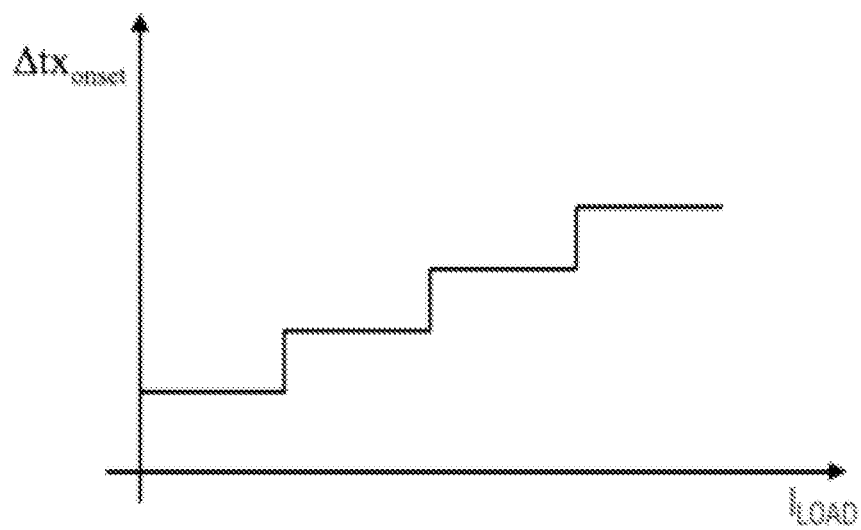
FIG. 16 shows a schematic graph of a desired value of a time difference as a function of the load current.

Conversely, if $\Delta t1_{ON}$ is less than $\Delta t1_{ONSET}$, $Ig2_{ON}$ is reduced by the increment $Ig2_{ONINC}$. The target values of the time difference $\Delta t1_{ONSET}$, $\Delta t2_{ONSET}$, $\Delta t1_{OFFSET}$ and $\Delta t2_{OFFSET}$ are functions of the subdivision of the load current $I_{LOAD}$. The target values of the time difference $\Delta tx_{ONSET}$ and $\Delta tx_{OFFSET}$ are related to the load current $I_{LOAD}$, as is shown in FIG. 16. This enables simple implementation in the gate driver circuit 2. FIG. 16 is a schematic graph of the desired value $\Delta tx_{ONSET}$ as a function of the load current $I_{LOAD}$.

Figure 17:
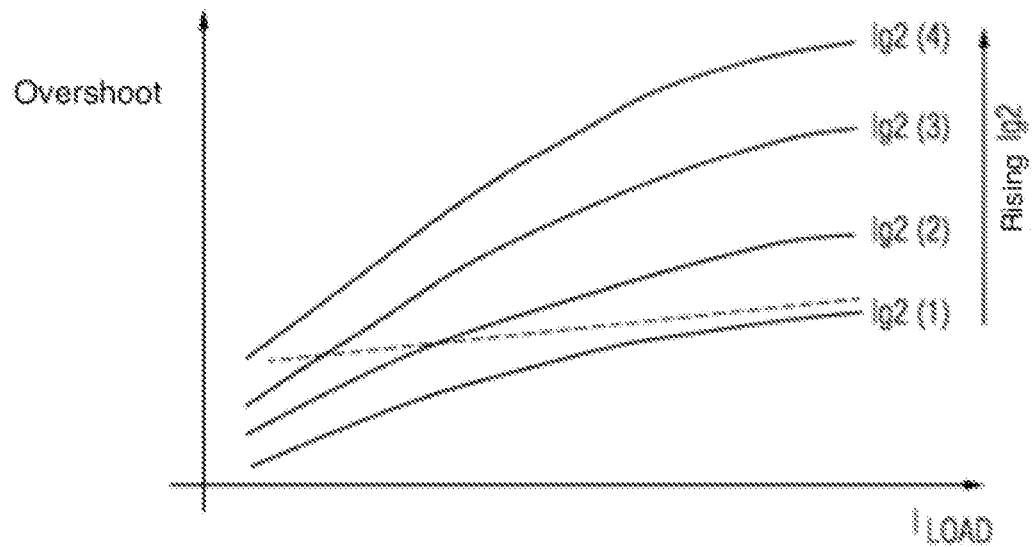
FIG. 17 shows a schematic graph for illustrating the overshoot behavior for different second current values of the gate current.
Figure 18:
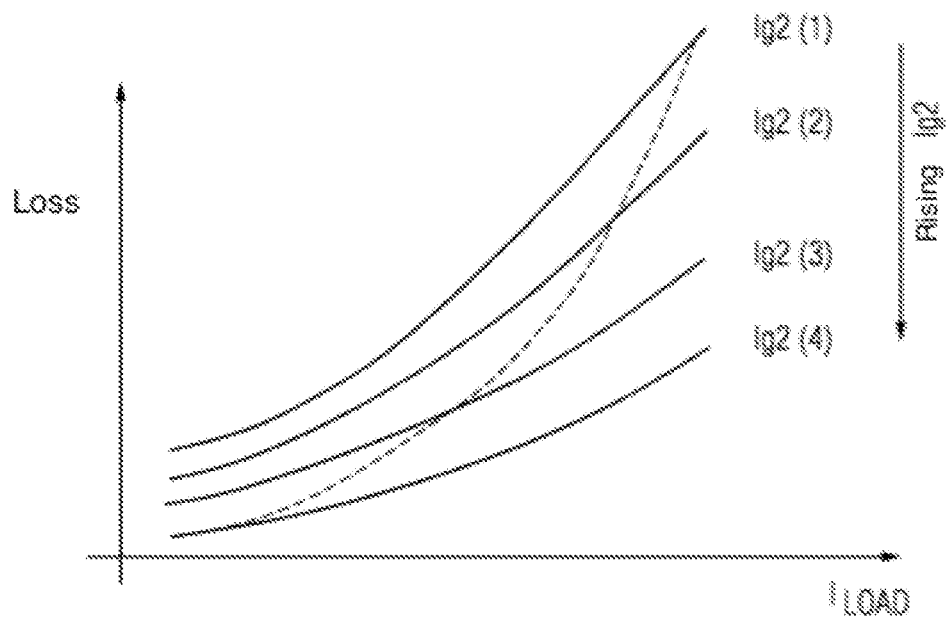
FIG. 18 shows a schematic graph for illustrating the loss behavior for different second current values of the gate current.

FIG. 17 is a schematic graph for illustrating the overshoot behavior for different second current values $Ig2(1)$ to $Ig2(4)$ of the gate current $I_g$. FIG. 18 is a schematic graph for illustrating the loss behavior for different second current values $Ig2(1)$ to $Ig2(4)$ of the gate current $I_g$. Since the method provides $\Delta tx_{SET}$ values for different load current ranges, the control algorithm selects different current values $Ig2$ depending on the subrange of the load current $I_{LOAD}$. This enables more flexibility in order to optimize electromagnetic compatibility and losses during switching. If $Ig2$ is varied, for example, from $Ig2(4)$ to $Ig2(1)$, the ranges above the dashed line are power gains. In FIGS. 17 and 18, the second current value $Ig2(1)$ is at the lowest and the second current value $Ig2(4)$ is at the highest. If, for example, $Ig2(4)$ is selected as second current value, the switching of the MOSFET from Off to On or from On to Off takes place more quickly since the gate is charged more quickly. Therefore, the power loss during the switching is lower, but the overshoot level is higher.

The default values for $t1_{on}$, $t2_{on}$, $t1_{off}$ and $t1_{off}$ are determined in accordance with the first implementation for the first subrange of the load current $I_{LOAD}$. The default values for $t1_{on}$, $t2_{on}$, $t1_{off}$ and $t1_{off}$ for the other subranges of the load current $I_{LOAD}$ are related to one another linearly or via a simple nonlinear function, as is shown in FIG. 13. Every time the phase current is in the first subrange of the load current, the method in accordance with the first implementation is implemented in order to arrive at the desired default values $t_{x\_DEF}$.

Even when the default values for $t1_{on\_def}$ are not converged within one cycle of the electrical commutation, this does not impair the performance drastically. This is because the overshoot is constant over a range of $t1_{on}$ values. The last value for $t1_{on}$ at the end of the iteration (in a subrange of the load current $I_{LOAD}$) can be used to form the initial values for $t1_{on}$ for the next subranges. This also applies to the remaining default values.

In order to achieve a minimum volume resistance $R_{DS(on)}$ at the MOSFET HS, LS, the gate-source voltage $V_{GS}$ should reach a sufficiently high value (for example $V_{GS}>10V$). This may be impossible when using current sources with a voltage which is very close to the desired gate-source voltage $V_{GS}$. When the switch-on is concluded, it is necessary for this reason to leave the current source mode in order to achieve the final gate-source voltage $V_{GS}$. This takes place at the end of the time period in which the third current value $Ig3$ is used to drive the MOSFET HS, LS (FIG. 8). The time at the end of this time period can be determined in various ways, for example by a timer which is triggered at the beginning of the Miller plateau MP or by a comparator for the gate-source voltage $V_{GS}$. Since, in the case of the freewheeling MOSFET HS, LS, no Miller plateau MP is present, the end of the current source mode can be determined by a comparator for the gate-source voltage $V_{GS}$ or a timer which starts when the switching begins.

Something similar also occurs during switch-off: During the Off time, undesired switch-on of the MOSFET HS, LS as a result of coupling to other signals should be avoided. In this case, the current source could also not achieve the desired level due to low supply voltage of the current source itself. Therefore, the current source mode needs to be left in this case, too. This takes place when the time period in which the third current value $Ig3$ is used to drive the MOSFET HS, LS has elapsed. The end of this time period can be determined by the same comparators for VGS which are already used for checking when both MOSFETs HS, LS are switched off.

The gate driver circuit 2 can be implemented completely or partially in an integrated circuit, for example an ASIC or ASSP.

A number of implementations have been described. Nevertheless, it will be understood that various modifications may be made without departing from the spirit and scope of the disclosure. Accordingly, other implementations are within the scope of the following claims.

What is claimed is:

1. A method for switching power transistors in a power transistor circuit, the method comprising:
   providing power transistors, each power transistor has a gate, the gate is driven sequentially by at least three control values;
   providing a gate-source voltage of the respective power transistor;
   providing a Miller plateau detector for detecting a Miller plateau in the gate-source voltage of the respective power transistor;
   switching over between the control values at specific times in a switch-on sequence and/or a switch-off sequence;
   wherein the specific times are determined or modified by a controller, the controller being driven by the Miller plateau detector,
   wherein the Miller plateau is detected in each working cycle in which the respective power transistor is not freewheeling, and
   wherein the method further comprises: adapting the specific times for a next working cycle in which the respective power transistor is not freewheeling based on the Miller plateau being detected in each working cycle in which the respective power transistor is not freewheeling.

2. The method of claim 1, further comprising:
   providing a half-bridge as part of the power transistor circuit; and
   supplying a phase voltage of the half-bridge or any voltage or any current of this half-bridge to the Miller plateau detector for detecting the Miller plateau.

3. The method of claim 1, wherein the Miller plateau detector is based on the detection of voltage transients at a source connection of a power transistor in the lower bridge branch of this half-bridge or on the detection of overshoot.

4. The method of claim 1, further comprising:
   detecting, by the Miller plateau detector, when the Miller plateau begins or when the Miller plateau begins and ends.

5. The method of claim 2, wherein the Miller plateau is detected by a comparator contained in the Miller plateau detector based on the phase voltage.

6. A method for switching power transistors in a power transistor circuit, the method comprising:
   providing power transistors, each power transistor has a gate, the gate is driven sequentially by at least three control values;
   providing a gate-source voltage of the respective power transistor;

providing a Miller plateau detector for detecting a Miller plateau in the gate-source voltage of the respective power transistor;

switching over between the control values at specific times in a switch-on sequence and/or a switch-off sequence; and adapting the second control value during the switch-on and switch-off of the power transistor depending on a level of a load current, wherein the specific times are determined or modified by a controller, the controller being driven by the Miller plateau detector, wherein, during switch-on, a change from a first control value to a second control value takes place by a time difference prior to a beginning of the Miller plateau and/or in that the change from the second control value to a third control value takes place during switch-on by a time difference after the beginning of the Miller plateau and/or in that, during switch-off, the change from the first control value to the second control value takes place by a time difference after the Miller plateau has been reached and/or in that, during switch-off, the change from the second control value to the third control value takes place by a time difference after the Miller plateau has been reached.

7. A method for switching power transistors in a power transistor circuit, the method comprising:

providing power transistors, each power transistor has a gate, the gate is driven sequentially by at least three control values;

providing a gate-source voltage of the respective power transistor;

providing a Miller plateau detector for detecting a Miller plateau in the gate-source voltage of the respective power transistor; and switching over between the control values at specific times in a switch-on sequence and/or a switch-off sequence;

wherein the specific times are determined or modified by a controller, the controller being driven by the Miller plateau detector, and wherein the driving using the at least three control values occurs only for non-freewheeling power transistors in the power transistor circuit, while freewheeling power transistors are driven by a constant control value.

8. The method of claim 2, further comprising, in order to detect whether a power transistor in a half-bridge is freewheeling in a next working cycle, during a dead time during which both power transistors of the same half-bridge are switched off, measuring the phase voltage, wherein when the phase voltage is high, the power transistor in a lower branch of the same half-bridge is identified as freewheeling in a next working cycle.

9. The method of claim 2, wherein, in a power transistor circuit having at least two half-bridges, a power transistor which has been driven to switch on by at least three different control values is also driven to switch off in the same working cycle by at least three different control values, and in that a power transistor which has been driven to switch on by a constant control value is also driven to switch off in the same working cycle by a constant control value apart from when a long pulse is detected which causes a change in a polarity of the phase current of the respective half-bridge.

10. The method of claim 9, further comprising, in order to determine a long pulse during switch-on of a power transistor in one of the half-bridges, starting a counter whose counter reading is increased by one every time a new working cycle is used on one of the other half-bridges, wherein when the counter has reached a specific value, disconnecting the power transistor using at least three different control values.

11. The method of claim 1, wherein the specific times are varied depending on a load current and/or in that at least one target value of at least one of a time differences is varied depending on the load current.

12. The method of claim 11, wherein, when using the at least three control values, the second control value is adapted corresponding to the level of the load current during the switch-on and switch-off of the power transistor.

13. The method of claim 1, wherein the control values are set by a source which is driven by the controller and is operated in a current source mode, wherein the source is switched over from the current source mode to a voltage source mode at the end of the switch-on sequence and/or the switch-off sequence.

14. The method of claim 13, wherein the end of the switch-on sequence and/or the switch-off sequence is detected by:

a timer which is triggered at the beginning of the Miller plateau, or a comparator for the gate-source voltage.

15. A power transistor circuit for switching power transistors supported by the power transistor circuit, the power transistor circuit comprising:

power transistors, each power transistor has a gate, the gate is driven sequentially by at least three control values;

a gate-source voltage of the respective power transistor;

a Miller plateau detector for detecting a Miller plateau in the gate-source voltage of the respective power transistor;

a controller being driven by the Miller plateau detector, the controller switching over between the control values at specific times in a switch-on sequence and/or a switch-off sequence; and determining or modifying the specific times, wherein, during switch-on, a change from a first control value to a second control value takes place by a time difference prior to a beginning of the Miller plateau and/or in that the change from the second control value to a third control value takes place during switch-on by a time difference after the beginning of the Miller plateau and/or in that, during switch-off, the change from the first control value to the second control value takes place by a time difference after the Miller plateau has been reached and/or in that, during switch-off, the change from the second control value to the third control value takes place by a time difference after the Miller plateau has been reached, and wherein the second control value is adapted during the switch-on and switch-off of the power transistor depending on a level of a load current.

\* \* \* \* \*